United States Patent
Takenaka (10) Patent No.: US 6,725,440 B2
(45) Date of Patent: Apr. 20, 2004

(54) SEMICONDUCTOR INTEGRATED CIRCUIT DEVICE COMPRISING A PLURALITY OF SEMICONDUCTOR DEVICES FORMED ON A SUBSTRATE

(75) Inventor: Hiroshi Takenaka, Kyoto (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 320 days.

(21) Appl. No.: 09/812,947

(22) Filed: Mar. 27, 2001

(65) Prior Publication Data

US 2001/0052603 A1 Dec. 20, 2001

(30) Foreign Application Priority Data

Mar. 27, 2000 (JP) ........................................ 2000-085775

(51) Int. Cl.$^7$ ................................................ G06F 17/50
(52) U.S. Cl. .................................. 716/13; 716/14; 716/7
(58) Field of Search ................................. 716/13, 12, 8, 716/19, 1, 7, 14

(56) References Cited

U.S. PATENT DOCUMENTS

| | | | | |
|---|---|---|---|---|
| 5,636,129 A | * | 6/1997 | Her ................................ | 716/12 |
| 5,729,469 A | * | 3/1998 | Kawakami .................... | 716/13 |
| 5,784,289 A | * | 7/1998 | Wang ............................. | 716/8 |

FOREIGN PATENT DOCUMENTS

| | | |
|---|---|---|
| JP | 60224243 A | 11/1985 |
| JP | 62156816 A | 7/1987 |
| JP | 63257226 A | 10/1988 |
| JP | 63258042 A | 10/1988 |
| JP | 63-258042 | 10/1988 |
| JP | 01286310 A | 11/1989 |
| JP | 02021636 A | 1/1990 |
| JP | 03142857 A | 6/1991 |
| JP | 10223508 A | 8/1998 |
| JP | 11121723 A | 4/1999 |
| JP | 11219889 A | 8/1999 |

* cited by examiner

Primary Examiner—Leigh M. Garbowski
Assistant Examiner—Brandon Bowers
(74) Attorney, Agent, or Firm—Nixon Peabody, LLP (57) ABSTRACT

In a semiconductor integrated circuit device including a plurality of semiconductor devices formed on a substrate, the principal plane of the substrate is partitioned into a plurality of device regions and into a plurality of routing regions each crossing a boundary between the plural device regions. A device group including one or more semiconductor devices among the plural semiconductor devices and a local interconnect for connecting the semiconductor devices included in the device group are disposed within the plural device regions. A global routing for connecting the device groups to each other is disposed within each of the plural routing regions.

6 Claims, 6 Drawing Sheets

SEMICONDUCTOR INTEGRATED CIRCUIT DEVICE COMPRISING A PLURALITY OF SEMICONDUCTOR DEVICES FORMED ON A SUBSTRATE

BACKGROUND OF THE INVENTION

The present invention relates to a semiconductor integrated circuit device including a plurality of semiconductor devices formed on a substrate and an exposure method employed for fabricating the same.

In fabrication of semiconductor integrated circuit devices, a reduction projection aligner employed in a step and repeat drawing method (hereinafter referred to as an optical stepper) is widely used.

Semiconductor integrated circuit technology has been recently remarkably developed, and there has been a tendency for the minimum design rule to be reduced by approximately 70% and the chip area to be substantially doubled approximately every three years. In order to cope with the reduction and the increase of the chip area, an optical stepper has been variously developed not only to have larger numerical aperture (NA) and use exposing light of a shorter wavelength for improving resolution but also to have a larger area of an exposure region (field). In the newest optical stepper, one field has the maximum area of approximately 22 mm□ on a material to be exposed.

Furthermore, in fabrication of a semiconductor integrated circuit device having a dimension larger than one field of an optical stepper, for example, the following method has been employed (as is disclosed in Japanese Laid-Open Patent Publication No. 63-258042): The principal plane of a rectangular (herein including square) substrate to be formed into a semiconductor chip is partitioned into a plurality of small rectangular regions, each of which is dealt with as one field for exposure. A pattern of a functional block is formed within each small region and functional blocks of the respective small regions are connected to one another through interconnects crossing boundaries between the small rectangular regions. In this method, an interconnect for connecting the functional blocks (hereinafter referred to as a global routing) is formed by stitching the patterns transferred in the small rectangular regions in the exposure. Therefore, a global routing is generally formed in an interconnect layer having such a large width that a stitching error caused in stitching the patterns is negligible.

Figure 5:
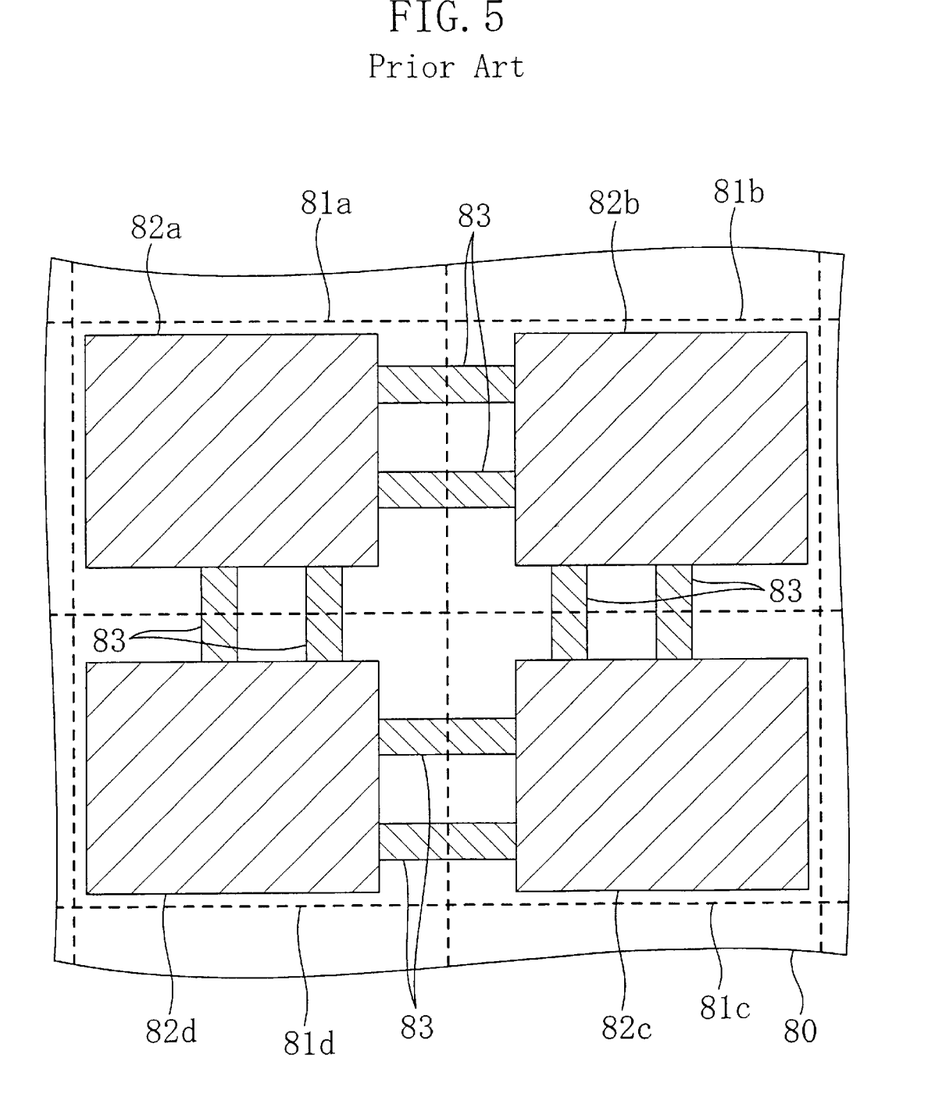
FIG. 5 is an enlarged plane view of a part of a conventional semiconductor integrated circuit device.

FIG. 5 is an enlarged plane view of a part of a conventional semiconductor integrated circuit device fabricated by the aforementioned method.

As is shown in FIG. 5, the principal plane of a substrate 80 is partitioned into a plurality of two-dimensionally arranged rectangular regions 81 (surrounded with broken lines). In using an optical stepper, each rectangular region 81 is dealt with as one field for exposure.

Furthermore, as is shown in FIG. 5, a first device group 82a, a second device group 82b, a third device group 82c and a fourth device group 82d each having fine patterns are respectively disposed in adjacent four rectangular regions 81, specifically, in a first rectangular region 81a, a second rectangular region 81b, a third rectangular region 81c and a fourth rectangular region 81d. Each of the device groups 82a through 82d includes at least one semiconductor device formed on the substrate. Also, each of interconnects 83 for connecting the device groups 82a through 82d to one another is disposed so as to cross a boundary between the rectangular regions 81, namely, a field boundary indicated with the broken line.

Specifically, each interconnect 83 is formed by mutually stitching the patterns transferred in the rectangular regions 81 in the exposure, and hence, a stitching error can be caused in a portion positioned on the field boundary in the interconnect 83. Therefore, an interconnect layer for each interconnect 83 should be formed as a pattern layer having a comparatively large design rule so as not to cause disconnection or short-circuit derived from the stitching error.

On the other hand, in accordance with recent rapid development in shrink of devices, an electron beam stepper using electron beam as an exposing energy source (electron projection lithography; hereinafter referred to as EPL), attaining higher resolution than an optical stepper, has been studied and developed.

In an electron lens used in the EPL, aberration is abruptly increased as the orbit of electrons is farther from the optical axis. Therefore, it is difficult for the electron lens to have a large field (of 20 mm□ or more) as that of an optical lens. Accordingly, the following method is to be employed in the EPL: The principal plane of a substrate to be exposed is partitioned into small regions (hereinafter referred to as sub-fields) each with an area of approximately 250 $\mu$m□ so as to transfer a pattern in each of the sub-fields. The patterns formed in the respective sub-fields are stitched to one another so as to form the pattern of the entire semiconductor chip.

The increase of the NA and the field of an optical stepper leads to increase of a lens diameter of an imaging optical system. As a result, the lens diameter has already increased to the limit of industrial fabrication. Therefore, it is difficult to further increase both the NA and the field. In addition, since a mask pattern has been also reduced in accordance with the reduction of a device, it is also difficult to keep dimensional accuracy in a mask pattern.

Accordingly, in an optical stepper, the reduction ratio is examined to be decreased to ×1/6 through ×1/10 from the current reduction ratio of ×1/4 through ×1/5. On the contrary, when the reduction ratio is decreased, it is difficult to form a circuit pattern of an entire semiconductor chip in one mask. Therefore, also in employing an optical stepper, some exposure method is being developed in order to form a pattern of an entire semiconductor chip with the principal plane of a substrate with the semiconductor chip partitioned into several fields in each of which a pattern is transferred.

When patterns transferred in respective fields or sub-fields are stitched to one another by using an optical stepper or EPL, however, a stitching error is caused in a stitched portion between the patterns as described above. For example, when the EPL is used, each sub-field with an area of approximately 250 $\mu$m□ has a stitched portion and a stitching error is caused in each stitched portion.

Figure 6A:
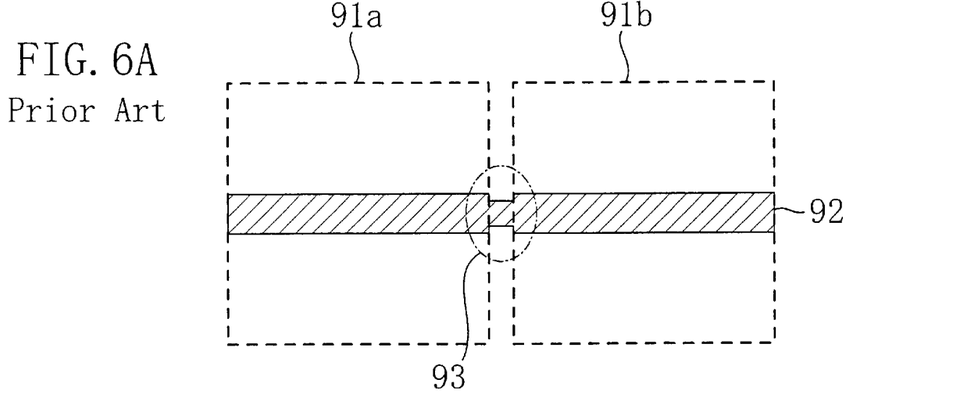
FIGS. 6A, 6B and 6C are diagrams of stitching errors caused in stitched portions between patterns in the conventional semiconductor integrated circuit device.
Figure 6B:
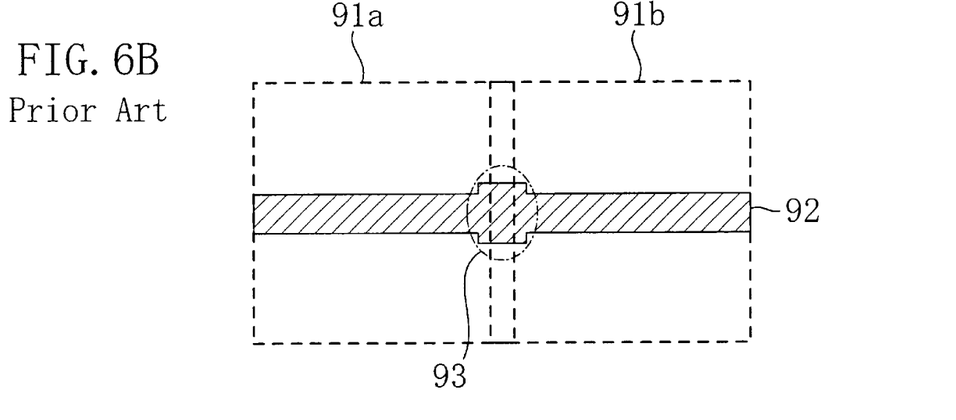
Figure 6C:
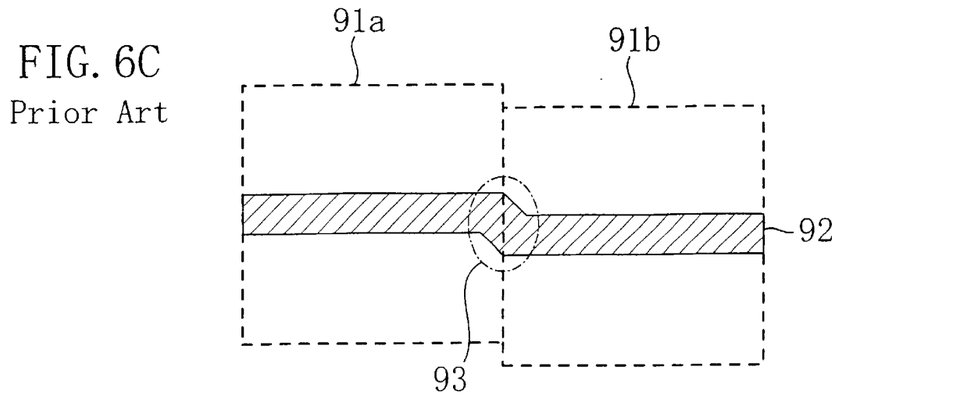

FIGS. 6A through 6C are diagrams of exemplified stitching errors caused in stitched portions between patterns in a conventional semiconductor integrated circuit device. In FIGS. 6A through 6C, reference numerals 91a and 91b (each surrounded with a broken line) denote adjacent exposure regions (each corresponding to one field in an optical stepper or one sub-field in the EPL), a reference numeral 92 denotes a pattern formed by stitching patterns respectively transferred in the exposure regions 91a and 91b, and a reference numeral 93 denotes a stitched portion of the pattern 92.

When the exposure regions 91a and 91b are away from each other as is shown in FIG. 6A, the stitched portion 93 of the pattern 92 is locally narrowed.

When the exposure regions 91a and 91b partially overlap each other as is shown in FIG. 6B, the stitched portion 93 of the pattern 92 is locally widen.

Alternatively, when the exposure regions 91a and 91b are shifted from each other as is shown in FIG. 6C, the stitched portion 93 of the pattern 92 is bent.

In an actual semiconductor integrated circuit device, the local dimensional variation of the pattern as is shown in FIGS. 6A and 6B and the bend of the pattern as is shown in FIG. 6C are mixed so as to cause stitching errors, resulting in degrading the performance and the reliability of the device. For example, when a stitching error is caused in a gate electrode formed on an active region, there arises a problem of variation in the threshold voltage and the like. Alternatively, when a stitching error is caused in an interconnect layer, stress migration or electromigration is caused, resulting in largely degrading the reliability of the device.

On the other hand, when the aforementioned method disclosed in Japanese Laid-Open Patent Publication No. 63-258042 is applied to the EPL using sub-fields each having the maximum area of approximately 250 $\mu m\square$, it is necessary to interconnect functional blocks to one another by using merely pattern layers having such a comparatively large design rule that a stitching error is negligible. Therefore, freedom in the mask pattern layout design for an integrated circuit is largely restricted.

SUMMARY OF THE INVENTION

In consideration of the aforementioned conventional problems, an object of the invention is forming a circuit pattern larger than one field of an optical stepper or one sub-field of EPL without a stitching error.

In order to achieve the object, the first semiconductor integrated circuit device of this invention comprises a plurality of semiconductor devices formed on a substrate, and a principal plane of the substrate is partitioned into a plurality of device regions and into a plurality of routing regions each crossing a boundary between the plurality of device regions, a device group including one or more semiconductor devices among the plurality of semiconductor devices and a local interconnect for connecting the semiconductor devices included in the device group are disposed within the plurality of device regions, and a global routing for connecting the device groups to each other is disposed within the plurality of routing regions.

In the first semiconductor integrated circuit device, a device group including one or more semiconductor devices and a local interconnect for connecting the semiconductor devices included in the device group are disposed within the device regions partitioning the principal plane of the substrate. Therefore, when the dimension of the device regions is set to be equal to or smaller than one field of an optical stepper or one sub-field of EPL, the device group and the local interconnect can be formed within the device regions without a stitching error. As a result, variation or degradation of the device characteristic derived from a stitching error can be prevented. Also, disconnection or the like of the local interconnect caused by electromigration or stress migration derived from a stitching error can be avoided. Accordingly, the performance and the reliability of the semiconductor integrated circuit device can be prevented from degrading.

Furthermore, in the first semiconductor integrated circuit device, a global routing for connecting the device groups is disposed within the routing regions partitioning the principal plane of the substrate and crossing boundaries between the device regions. Therefore, when the dimension of routing regions is set to be equal to or smaller than one field of an optical stepper or one sub-field of EPL, a global routing crossing a boundary between the device regions, for example a global routing for connecting the device groups disposed within an adjacent pair of device regions to each other, can be formed without a stitching error. Accordingly, the device groups, namely, the functional blocks, can be connected to one another over a large area without degrading the reliability of the global routings. As a result, the semiconductor integrated circuit device can attain a large chip area.

In addition, in the first semiconductor integrated circuit device, the dimensions of the device regions and the routing regions are variable, and hence, freedom in mask pattern layout design for the integrated circuit can be improved.

The second semiconductor integrated circuit device of this invention comprises a plurality of semiconductor devices formed on a substrate, and a principal plane of the substrate is partitioned into a plurality of device regions having one shape and two-dimensionally arranged in a repetitive cycle corresponding to the shape and into a plurality of routing regions having the shape and two-dimensionally arranged in the repetitive cycle corresponding to the shape to be shifted from the plurality of device regions by a distance, a device group including one or more semiconductor devices among the plurality of semiconductor devices and a local interconnect for connecting the semiconductor devices included in the device group are disposed within the plurality of device regions, and a global routing for connecting the device groups to each other is disposed within the plurality of routing regions.

In the second semiconductor integrated circuit device, a device group including one or more semiconductor devices and a local interconnect for connecting the semiconductor devices included in the device group are disposed within the device regions partitioning the principal plane of the substrate. Therefore, when the dimension of the device regions is set to be equal to or smaller than one field of an optical stepper or one sub-field of EPL, the device group and the local interconnect can be formed within the device regions without a stitching error. As a result, variation or degradation of the device characteristic derived from a stitching error can be prevented. Also, disconnection or the like of the local interconnect caused by electromigration or stress migration derived from a stitching error can be avoided. Accordingly, the performance and the reliability of the semiconductor integrated circuit device can be prevented from degrading.

Furthermore, in the second semiconductor integrated circuit device, a global routing for connecting the device groups to each other is disposed within the routing regions partitioning the principal plane of the substrate and arranged in the same repetitive cycle as that of the device regions to be shifted from the device regions by a predetermined distance. Therefore, when the dimension of the routing regions is set to be equal to or smaller than one field of an optical stepper or one sub-field of EPL, a global routing crossing a boundary between the device regions, for example, a global routing for connecting the device groups disposed within adjacent pair of device regions to each other, can be formed without a stitching error. Accordingly, the device groups, namely, the functional blocks, can be connected to one another over a large area without degrading the reliability of the global routings. As a result, the semiconductor integrated circuit device can attain a large chip area.

In addition, in the second semiconductor integrated circuit device, the device regions and the routing regions are in a predetermined shape and two-dimensionally arranged in the repetitive cycle corresponding to the shape. Therefore, each of the device regions and the routing regions can be easily dealt with as one field of an optical stepper or one sub-field of EPL for the exposure.

In the first or second semiconductor integrated circuit device, a routing terminal crossing a boundary between the plurality of routing regions is preferably disposed within at least one of the plurality of device regions.

In this manner, the global routings disposed in an adjacent pair of device regions can be connected to each other through the routing terminal. Therefore, a global routing can be formed to extend over substantially three or more device regions, resulting in improving the freedom in the mask pattern layout design for the integrated circuit.

In the second semiconductor integrated circuit device, the distance is preferably a half of the repetitive cycle.

In this manner, the global routings can be formed to extend by substantially the same distances in an adjacent pair of device regions. Therefore, the freedom in the mask pattern layout design for the integrated circuit can be improved.

The first exposure method of this invention comprises the steps of forming a lower layer pattern on a substrate to be exposed by successively forming a corresponding pattern in each of a plurality of first regions obtained by partitioning a principal plane of the substrate to be exposed through exposure using electromagnetic waves or a charged particle beam; and forming an upper layer pattern over the lower layer pattern on the substrate to be exposed by successively forming a corresponding pattern in each of a plurality of second regions obtained by partitioning the principal plane of the substrate to be exposed through the exposure using electromagnetic waves or a charged particle beam, and each of the plurality of second regions crosses a boundary between the plurality of first regions.

In the first exposure method, the lower layer pattern is formed by successively forming a corresponding pattern in each of the plural first regions partitioning the principal plane of the substrate to be exposed, and thereafter, the upper layer pattern is formed by successively forming a corresponding pattern in each of the plural second regions partitioning the principal plane of the substrate to be exposed. Therefore, when the dimension of each of the first and second regions is set to be equivalent to one field of an optical stepper or one sub-field of EPL, an integrated circuit pattern larger than one exposure region can be definitely formed on the substrate to be exposed.

Furthermore, in the first exposure method, each of the plural second regions, where the patterns included in the upper layer pattern are formed, crosses a boundary between the plural first regions, where the patterns included in the lower layer pattern are formed. Therefore, even when the upper layer pattern includes a pattern crossing a boundary between the first regions, the pattern can be formed without a stitching error. As a result, the integrated circuit pattern can be accurately formed.

In addition, in the first exposure method, the dimensions of the first and second regions are variable, and hence, the freedom in the mask pattern layout design for the integrated circuit can be improved.

The second exposure method of this invention comprises the steps of forming a lower layer pattern on a substrate to be exposed by successively forming a corresponding pattern in each of a plurality of first regions obtained by partitioning a principal plane of the substrate to be exposed through exposure using electromagnetic waves or a charged particle beam; and forming an upper layer pattern over the lower layer pattern on the substrate to be exposed by successively forming a corresponding pattern in each of a plurality of second regions obtained by partitioning the principal plane of the substrate to be exposed through the exposure using electromagnetic waves or a charged particle beam, and the plurality of first regions are in one shape and two-dimensionally arranged in a repetitive cycle corresponding to the shape, and the plurality of second regions are in the shape and two-dimensionally arranged in the repetitive cycle corresponding to the shape to be shifted from the plurality of first regions by a distance.

In the second exposure method, the lower layer pattern is formed by successively forming a corresponding pattern in each of the plural first regions partitioning the principal plane of the substrate to be exposed, and thereafter, the upper layer pattern is formed by successively forming a corresponding pattern in each of the plural second regions partitioning the principal plane of the substrate to be exposed. Therefore, when the dimension of each of the first and second regions is set to be equivalent to one field of an optical stepper or one sub-field of EPL, an integrated circuit pattern larger than one exposure region can be definitely formed on the substrate to be exposed.

Furthermore, in the second exposure method, the plural second regions, where the patterns included in the upper layer pattern are formed, are arranged in the same repetitive cycle as that of the plural first regions, where the patterns included in the lower layer pattern are formed, to be shifted from the first regions by a predetermined distance. Therefore, even when the upper layer pattern includes a pattern crossing a boundary between the first regions, the pattern can be formed without a stitching error. As a result, the integrated circuit pattern can be accurately formed.

In addition, in the second exposure method, the first regions and the second regions are in a predetermined shape and two-dimensionally arranged in the repetitive cycle corresponding to the shape. Therefore, each of the first and second regions can be easily dealt with as one field of an optical stepper or one sub-field of EPL for the exposure.

DETAILED DESCRIPTION OF THE INVENTION

Embodiment 1

A semiconductor integrated circuit device according to Embodiment 1 of the invention and an exposure method employed for fabricating the same will now be described with reference to the accompanying drawing. The semiconductor integrated circuit device of Embodiment 1 includes a plurality of semiconductor devices formed on a substrate.

Figure 1:
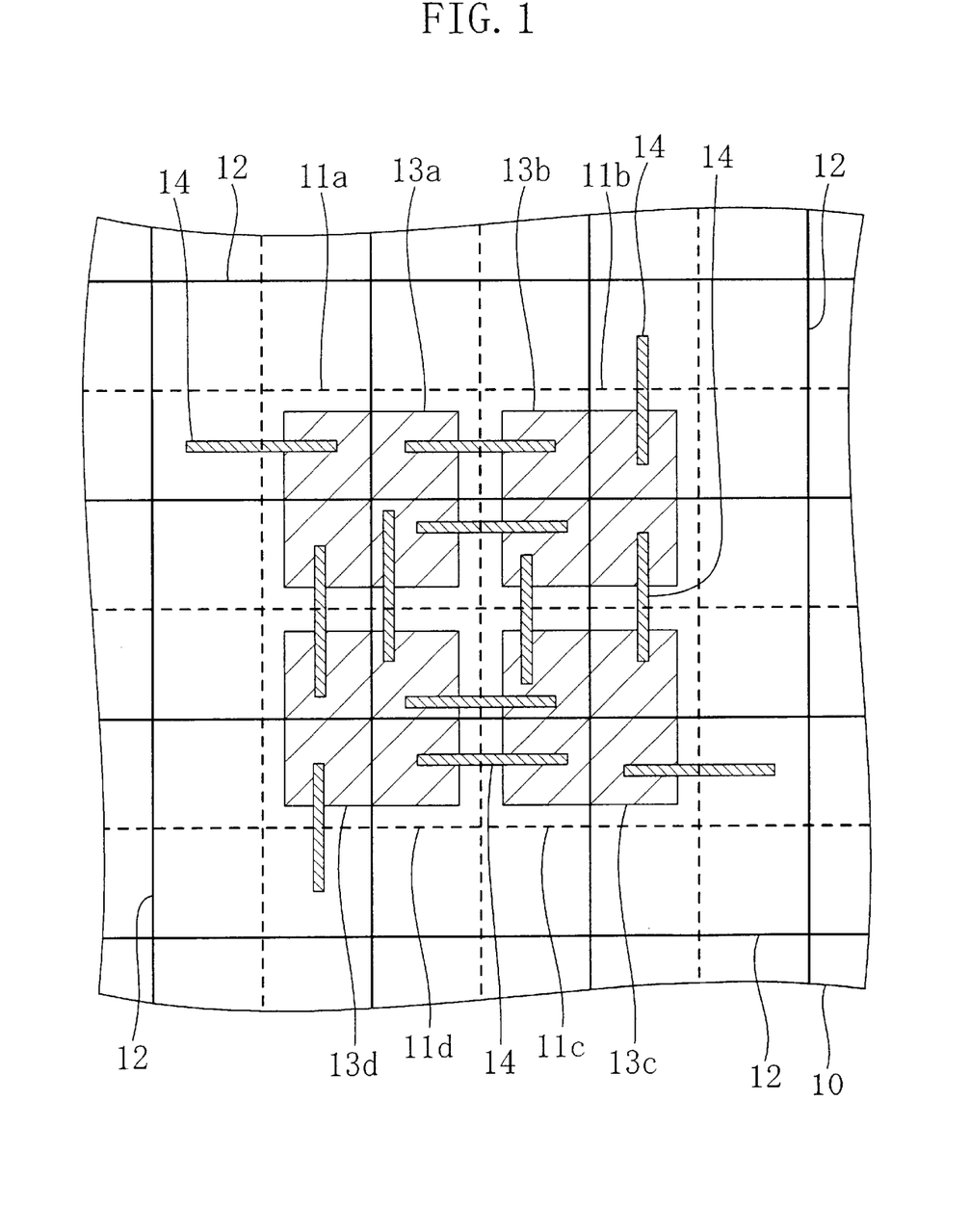
FIG. 1 is an enlarged plane view of a part of a semiconductor integrated circuit device according to Embodiment 1 of the invention.

FIG. 1 is an enlarged plane view of a part of the semiconductor integrated circuit device according to Embodiment 1.

As is shown in FIG. 1, the principal plane of a substrate 10 is partitioned not only into a plurality of device regions 11 (surrounded with broken lines), each in a predetermined shape such as a rectangular shape, two-dimensionally arranged in a repetitive cycle corresponding to the shape but also into a plurality of routing regions 12 (surrounded with thick solid lines), each in the same shape as the device region 11, two-dimensionally arranged in a repetitive cycle corresponding to the shape to be shifted from the device regions 11 by a predetermined distance. Specifically, in Embodiment 1, the routing regions 12 are shifted from the device regions 11 by a distance corresponding to a half of the repetitive cycle of the device regions 11 (which is the same as the repetitive cycle of the routing regions 12).

Also, as is shown in FIG. 1, a functional block 13 corresponding to a basic element circuit such as a logic gate is disposed within each device region 11. In other words, each functional block 13 is disposed so as not to cross a boundary between the device regions 11. Each functional block 13 is constructed from a device group including at least one semiconductor device of the plural semiconductor devices (not shown) formed on the substrate 10 and a local interconnect (not shown) for connecting semiconductor devices included in the device group.

Specifically, a first functional block 13a, a second functional block 13b, a third functional block 13c and a fourth functional block 13d are respectively disposed within a first device region 11a, a second device region 11b, a third device region 11c and a fourth device region 11d adjacent to one another. In the case where, for example, a MOS (metal oxide semiconductor) transistor is used as the semiconductor device, each functional block 13 contains at least one MOS transistor device including an active region consisting of n-type and p-type diffusion layers formed in the substrate 10 and a gate electrode formed on the active region. At this point, each functional block 13 may include a resistance device formed in the active region, a capacitance device formed from the active region and the gate electrode, a diode device including a pn junction or the like.

Furthermore, each local interconnect is formed on an interlayer insulating film (not shown) on the substrate 10 bearing the semiconductor devices and connects the semiconductor devices to each other through a contact formed in the interlayer insulating film. In the case where all the local interconnects of the entire semiconductor integrated circuit device cannot be formed in one interconnect layer, however, an interlayer insulating film and an interconnect layer are repeatedly and alternately stacked so that all the local interconnects can be disposed. At this point, all the corresponding local interconnects are disposed within each device region 11 in all the interconnect layers for the local interconnects. Since a local interconnect is used for connecting semiconductor devices provided within a very small region, freedom in circuit design is minimally degraded even when all the local interconnects are disposed within each device region 11.

Moreover, as is shown in FIG. 1, a global routing 14 for connecting the functional blocks 13 disposed in an adjacent pair of device regions 11 is disposed within each routing region 12. In other words, each global routing 14 is disposed so as not to cross a boundary between the routing regions 12. Specifically, each global routing 14 is formed on an interlayer insulating film (not shown) on the substrate 10 bearing the functional blocks 13 (including the semiconductor devices and the local interconnects) and connects the adjacent functional blocks 13 to each other through a contact formed in the interlayer insulating film. In the case where all the global routings 14 of the entire semiconductor integrated circuit device cannot be disposed in one interconnect layer, however, an interlayer insulating film and an interconnect layer are repeatedly and alternately stacked so that all the global routings 14 can be disposed. At this point, each global routing 14 is disposed within the corresponding routing region 12 in all the interconnect layers for the global routings.

Now, the exposure method according to Embodiment 1, specifically, the exposure method employed for fabricating the semiconductor integrated circuit device of FIG. 1 will be described by exemplifying use of EPL.

First, the dimension of the device regions 11 and the routing regions 12 (all having the same dimension) is set to be equal to or smaller than the maximum sub-field size of the EPL. In this manner, each device region 11 and each routing region 12 can be dealt with as one sub-field for the exposure. The maximum sub-field size of currently developed EPL is approximately 250 $\mu$m□.

Next, in the respective plural device regions 11 partitioning the principal plane of the substrate 10, a pattern for forming the device group of the corresponding functional block 13, for example, a gate electrode pattern, is repeatedly formed through exposure using an electron beam, thereby forming the gate electrode patterns of the entire semiconductor integrated circuit device on the substrate 10. At this point, since each device group is provided within every device region 11, the gate electrode pattern can be formed without a stitching error.

Then, in the respective plural device regions 11, a local interconnect pattern of the corresponding functional block 13 is repeatedly formed through the exposure using an electron beam, thereby forming the local interconnect patterns of the entire semiconductor integrated circuit device on the substrate 10. At this point, since each local interconnect is formed within every device region 11, the local interconnect pattern can be formed without a stitching error.

Subsequently, in the respective plural routing regions 12 partitioning the principal plane of the substrate 10, a pattern of the corresponding global routing 14 is repeatedly formed through the exposure using an electron beam, thereby forming the patterns of the global routings 14 of the entire semiconductor integrated circuit device on the substrate 10. At this point, since each global routing 14 is formed within every routing region 12, the pattern of the global routing 14 can be formed without a stitching error.

As described so far, in the semiconductor integrated circuit device of Embodiment 1, the functional block 13, namely, the device group and the local interconnect, is formed within each device region 11 partitioning the principal plane of the substrate 10. Therefore, when the dimension of each device region 11 is set to be equal to or smaller than one sub-field of the EPL, the device group and the local interconnect can be formed within every device region 11 without a stitching error. As a result, variation or degradation of the device characteristic derived from a stitching error can be prevented. Also, disconnection or the like of the local interconnect due to electromigration or stress migration derived from a stitching error can be avoided. Accordingly, the performance and the reliability of the semiconductor integrated circuit device can be prevented from degrading.

Furthermore, in the semiconductor integrated circuit device of Embodiment 1, the global routing 14 for connecting the functional blocks 13 disposed in an adjacent pair of device regions 11 is formed within each of the routing regions 12 partitioning the principal plane of the substrate 10 and arranged in the same repetitive cycle as that of the device regions 11 to be shifted from the device regions 11 by a predetermined distance. Therefore, when the dimension of each routing region 12 is set to be equal to or smaller than one sub-field of the EPL, the global routing 14 crossing a boundary between the device regions 11 can be formed without a stitching error. Accordingly, the functional blocks 13 can be connected to one another over a large area without degrading the reliability of the global routings 14. As a result, the semiconductor integrated circuit device can attain a large chip area.

Moreover, in the semiconductor integrated circuit device of Embodiment 1, the device regions 11 and the routing regions 12 are in the same predetermined shape and two-dimensionally arranged in the repetitive cycle corresponding to the shape. Accordingly, each of the device regions 11 and the routing regions 12 can be easily dealt with as one sub-field of the EPL for the exposure.

In the exposure method of Embodiment 1, the gate electrode patterns or the local interconnect patterns of the entire semiconductor integrated circuit device are formed by successively forming a gate electrode pattern or a local interconnect pattern of the corresponding functional block 13 in each of the plural device regions 11 partitioning the principal plane of the substrate 10. Thereafter, the patterns of the global routings 14 of the entire semiconductor integrated circuit device are formed by successively forming a pattern of the corresponding global routing 14 in each of the plural routing regions 12 partitioning the principal plane of the substrate 10. Accordingly, when the dimension of each of the device regions 11 and the routing regions 12 is set to be equivalent to one sub-field of the EPL, an integrated circuit pattern larger than one sub-field can be definitely formed on the substrate 10.

Furthermore, in the exposure method of Embodiment 1, the plural routing regions 12 where the patterns of the respective global routings 14 are formed are arranged in the same repetitive cycle as that of the plural device regions 11 where the gate electrode patterns and the local interconnect patterns are formed to be shifted by a predetermined distance from the device regions 11. Accordingly, even when the pattern of a global routing 14 crosses a boundary between the device regions 11, the pattern can be formed without a stitching error, resulting in accurately forming the integrated circuit pattern.

Although the local interconnects are formed within the device regions 11 and the global routings 14 are formed within the routing regions 12 in the semiconductor integrated circuit device of Embodiment 1, a local interconnect may cross a boundary between the device regions 11 or a global routing 14 may cross a boundary between the routing regions 12 for the following reason: Interconnect layers of a semiconductor integrated circuit device have a multi-level structure and the width used in the interconnect layer is larger in an upper layer. Therefore, in an interconnect layer using such a large width that a stitching error is negligible, the reliability is never degraded even when a local interconnect or a global routing 14 is not formed within the device region 11 or the routing region 12. Also, in the case where a local interconnect crosses a boundary between the device regions 11 or in the case where a global routing 14 crosses a boundary between the routing regions 12, the freedom in mask pattern layout design for the integrated circuit can be improved.

Moreover, in the semiconductor integrated circuit device of Embodiment 1, a boundary between the device regions 11 or between the routing regions 12 may have a predetermined width.

In addition, in the semiconductor integrated circuit device of Embodiment 1, the routing regions 12 are preferably arranged to be shifted from the device regions 11 by a distance corresponding to a half of the repetitive cycle of the device regions 11 (which is the same as the repetitive cycle of the routing regions 12). In this manner, the global routings 14 can extend by substantially the same distance in an adjacent pair of device regions 11, and hence, the freedom in the mask pattern layout design for the integrated circuit device can be improved.

In the semiconductor integrated circuit device of Embodiment 1, the functional blocks 13 (semiconductor device and local interconnect) are not necessarily disposed within every device region 11 and the global routing 14 is not necessarily disposed within every routing region 12.

Although the EPL is employed in the exposure method of Embodiment 1, an optical stepper may be employed instead. In this case, the dimension of each device region 11 and each routing region 12 is set to be equal to or smaller than the maximum field size of the optical stepper, so that each of the device regions 11 and the routing regions 12 can be dealt with as one field for the exposure.

Modification of Embodiment 1

A semiconductor integrated circuit device according to a modification of Embodiment 1 and an exposure method employed for fabricating the same will now be described with reference to the accompanying drawing. The semiconductor integrated circuit device of the modification of Embodiment 1 includes a plurality of semiconductor devices formed on a substrate.

Figure 2:
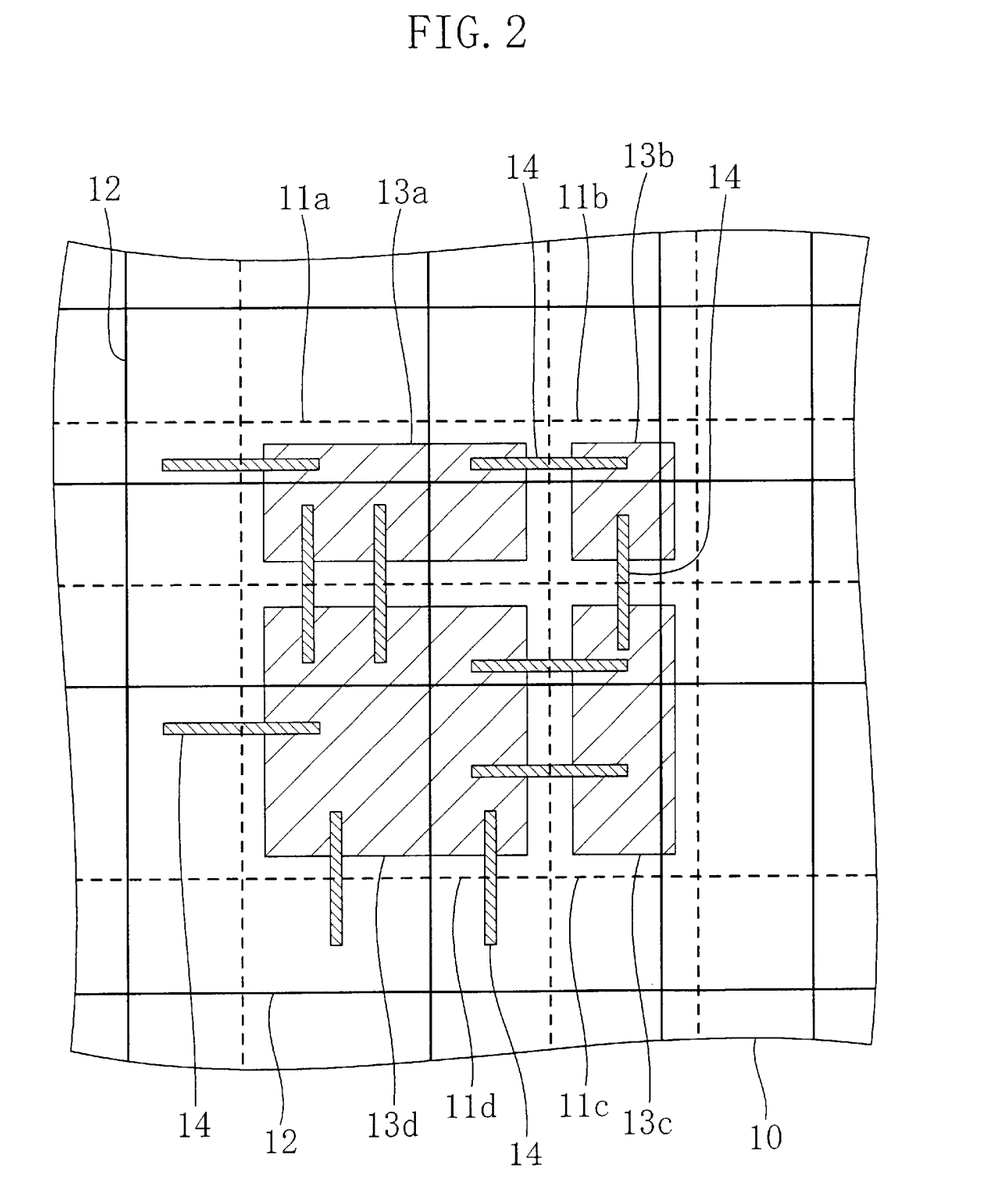
FIG. 2 is an enlarged plane view of a part of a semiconductor integrated circuit device according to a modification of Embodiment 1.

FIG. 2 is an enlarged plane view of a part of the semiconductor integrated circuit device according to the modification of Embodiment 1.

As is shown in FIG. 2, the principal plane of a substrate 10 is partitioned not only into a plurality of device regions 11 (surrounded with broken lines) but also into a plurality of routing regions 12 (surrounded with thick solid lines) formed to cross boundaries between the device regions 11. Specifically, the shapes of the device regions 11 and the routing regions 12 are variable in this modification differently from Embodiment 1.

Also, as is shown in FIG. 2, a functional block 13 including a device group and a local interconnect is disposed within each of the device regions 11 in the same manner as in Embodiment 1. Specifically, a first functional block 13a, a second functional block 13b, a third functional block 13c and a fourth functional block 13d are respectively disposed within a first device region 11a, a second device region 11b, a third device region 11c and a fourth device region 11d adjacent to one another.

Moreover, as is shown in FIG. 2, a global routing 14 for connecting the functional blocks 13 disposed in an adjacent pair of device regions 11 is disposed within each of the routing regions 12 in the same manner as in Embodiment 1.

Now, the exposure method according to the modification of Embodiment 1, specifically, the exposure method employed for fabricating the semiconductor integrated circuit device of FIG. 2 will be described by exemplifying use of the EPL.

First, the dimension of each device region 11 and each routing region 12 is set to be equal to or smaller than the maximum sub-field size of the EPL. Thus, each of the device regions 11 and the routing regions 12 can be dealt with as one sub-field for the exposure.

Next, in the respective plural device regions 11 partitioning the principal plane of the substrate 10, a pattern of the device group of the corresponding functional block 13, for example, a gate electrode pattern is repeatedly formed through exposure using an electron beam, thereby forming the gate electrode patterns of the entire semiconductor integrated circuit device on the substrate 10. At this point, since each device group is formed within every device region 11, the gate electrode pattern can be formed without a stitching error.

Then, in the respective device regions 11, a local interconnect pattern of the corresponding functional block 13 is repeatedly formed through the exposure using an electron beam, thereby forming the local interconnect patterns of the entire semiconductor integrated circuit device on the substrate 10. At this point, since each local interconnect is formed within every device region 11, the local interconnect pattern can be formed without a stitching error.

Subsequently, in the respective routing regions 12 partitioning the principal plane of the substrate 10, a pattern of the corresponding global routing 14 is successively formed through the exposure using an electron beam, thereby forming the patterns of the global routings 14 of the entire semiconductor integrated circuit device on the substrate 10. At this point, each global routing 14 is formed within every routing region 12, the pattern of the global routing 14 can be formed without a stitching error.

As described so far, in the semiconductor integrated circuit device according to the modification of Embodiment 1, the functional block 13, namely, the device group and the local interconnect, is formed within each of the device regions 11 partitioning the principal plane of the substrate 10. Therefore, when the dimension of each device region 11 is set to be equal to or smaller than one sub-field of the EPL, a device group and a local interconnect can be formed within every device region 11 without a stitching error. As a result, the variation or degradation of the device characteristic derived from a stitching error can be prevented. Also, disconnection or the like of the local interconnect caused by the electromigration or stress migration derived from a stitching error can be avoided. Accordingly, the performance and the reliability of the semiconductor integrated circuit device can be prevented from degrading.

Furthermore, in the semiconductor integrated circuit device according to the modification of Embodiment 1, a global routing 14 for connecting the functional blocks 13 disposed in an adjacent pair of device regions 11 is disposed within each of the routing regions 12 partitioning the principal plane of the substrate 10 and crossing the boundaries between the device regions 11. Therefore, when the dimension of each routing region 12 is set to be equal to or smaller than one sub-field of the EPL, a global routing 14 crossing a boundary between the device regions 11 can be formed without a stitching error. Accordingly, the functional blocks 13 can be connected to one another over a large area without degrading the reliability of the global routings 14. As a result, the semiconductor integrated circuit device can attain a large chip area.

Also in the semiconductor integrated circuit device of the modification of Embodiment 1, the dimensions of the device regions 11 and the routing regions 12 are variable, and hence, the freedom in the mask pattern layout design for the integrated circuit can be improved.

In the exposure method according to the modification of Embodiment 1, the gate electrode patterns and the local interconnect patterns of the entire semiconductor integrated circuit device are formed by repeatedly forming a gate electrode pattern and a local interconnect pattern of the corresponding functional block 13 in each of the plural device regions 11 partitioning the principal plane of the substrate 10. Thereafter, the patterns of the global routings 14 of the entire semiconductor integrated circuit device are formed by repeatedly forming a pattern of the corresponding global routing 14 in each of the plural routing regions 12 partitioning the principal plane of the substrate 10. Therefore, when the dimension of each of the device regions 11 and the routing regions 12 is set to be equivalent to one sub-field of the EPL, an integrated circuit pattern larger than one sub-field can be definitely formed on the substrate 10.

Furthermore, in the exposure method of the modification of Embodiment 1, each of the plural routing regions 12 where the patterns of the global routings 14 are formed crosses a boundary between the plural device regions 11 where the gate electrode patterns and the local interconnect patterns are formed. Therefore, even when the pattern of a global routing 14 crosses a boundary between the device regions 11, the pattern can be formed without a stitching error. As a result, the integrated circuit pattern can be accurately formed.

Although the local interconnects are formed within the device regions 11 and the global routings 14 are formed within the routing regions 12 in the semiconductor integrated circuit device of the modification of Embodiment 1, a local interconnect may cross a boundary between the device regions 11 or a global routing 14 may cross a boundary between the routing regions 12 for the following reason: Interconnect layers of the semiconductor integrated circuit device have a multi-level structure and the width used in the interconnect layer is larger in an upper layer. Therefore, in an interconnect layer using such a large width that a stitching error is negligible, the reliability is never degraded even when a local interconnect or a global routing 14 is not formed within the device region 11 or the routing region 12. Also, in the case where a local interconnect crosses a boundary between the device regions 11 or in the case where a global routing 14 crosses a boundary between the routing regions 12, the freedom in the mask pattern layout design for the integrated circuit can be improved.

Moreover, in the semiconductor integrated circuit device of the modification of Embodiment 1, a boundary between the device regions 11 or between the routing regions 12 may have a predetermined width.

In the semiconductor integrated circuit device of the modification of Embodiment 1, the functional blocks 13 (semiconductor device and local interconnect) are not necessarily disposed within every device region 11 and the global routing 14 is not necessarily disposed within every routing region 12.

Although the EPL is employed in the exposure method of the modification of Embodiment 1, an optical stepper may be employed instead. In this case, each of the dimensions of the device regions 11 and the routing regions 12 is set to be equal to or smaller than the maximum field size of the optical stepper, so that each of the device regions 11 and the routing regions 12 can be dealt with as one field for the exposure.

Embodiment 2

A semiconductor integrated circuit device according to Embodiment 2 of the invention will now be described with reference to the accompanying drawing.

Figure 3:
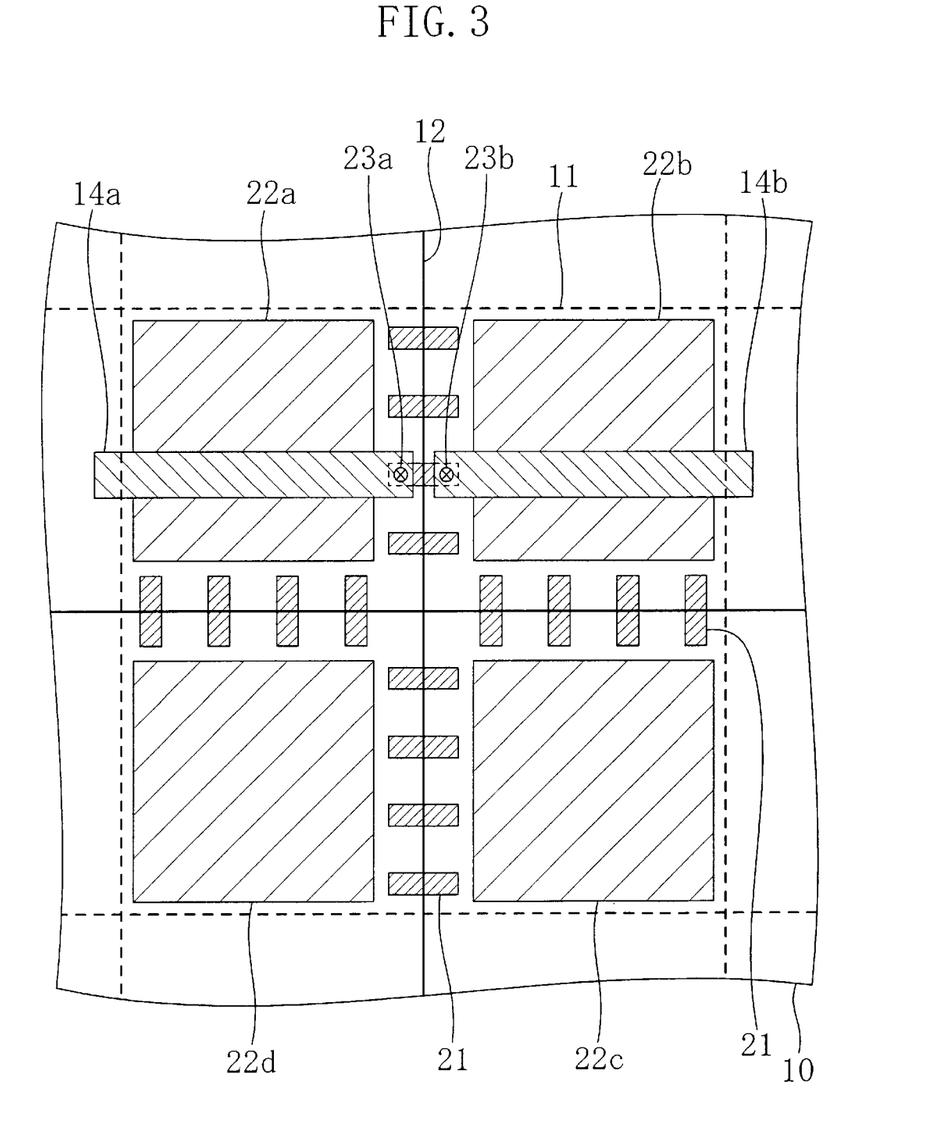
FIG. 3 is an enlarged plane view of a part of a semiconductor integrated circuit device according to Embodiment 2 of the invention.

FIG. 3 is an enlarged plane view of a part of the semiconductor integrated circuit device of Embodiment 2. The semiconductor integrated circuit device of Embodiment 2 is obtained by improving one device region 11 of the semiconductor integrated circuit device of Embodiment 1 shown in FIG. 1, and in FIG. 3, like reference numerals are used to refer to like elements used in Embodiment 1 shown in FIG. 1 so as to omit the description.

Embodiment 2 is different from Embodiment 1 in routing terminals 21 each crossing a boundary between routing regions 12 being disposed within one of a plurality of device regions 11 as is shown in FIG. 3. Specifically, one device region 11 is divided into four small regions by boundaries between adjacent four routing regions 12 (merely part of which are shown in FIG. 3), and a routing terminal 21 having a conducting property is formed to cross the boundary between the routing regions 12 and extend over two small regions. The routing terminal 21 is formed, for example, in an interconnect layer for a local interconnect, whereas the routing terminal 21 is connected to neither a semiconductor device nor a local interconnect.

In Embodiment 1, the functional block 13 is disposed within each device region 11 (as is shown in FIG. 1). In contrast, in Embodiment 2, a first sub-block 22a, a second sub-block 22b, a third sub-block 22c and a fourth sub-block 22d for constructing a functional block 13 are respectively disposed within the four small regions included in the device region 11 of FIG. 3. In this case, interconnects (not shown) for connecting the sub-blocks 22a through 22d are formed in regions between the routing terminals 21.

Also, as is shown in FIG. 3, the routing terminal 21 electrically connects a first global routing 14a and a second global routing 14b disposed within an adjacent pair of routing regions 12 to each other through a first contact 23a and a second contact 23b formed at the ends thereof. In this manner, the global routing 14 can be extended so as to substantially cross a boundary between the routing regions 12.

Embodiment 2 can attain the following effects in addition to the effects attained by Embodiment 1:

In Embodiment 1, each global routing 14 is disposed so as not to cross a boundary between the routing regions 12, and hence, the global routing 14 cannot be extended beyond a boundary between the routing regions 12, which restricts the freedom in the mask pattern layout design for the integrated circuit. In contrast, in Embodiment 2, the routing terminal 21 crossing a boundary between the routing regions 12 is disposed within the device region 11, and hence, the global routings 14 disposed in an adjacent pair of routing regions 12 can be connected to each other through the routing terminal 21. Accordingly, the global routing 14 can be formed to extend over substantially three or more device regions 11, resulting in improving the freedom in the mask pattern layout design for the integrated circuit.

Although the sub-blocks 22a through 22d are respectively disposed within the four small regions obtained by dividing the device region 11 by the boundaries between the routing regions 12 in Embodiment 2, the sub-block may be disposed so as to cover two or more of the four small regions.

Modification of Embodiment 2

A semiconductor integrated circuit device according to a modification of Embodiment 2 will now be described with reference to the accompanying drawing.

Figure 4:
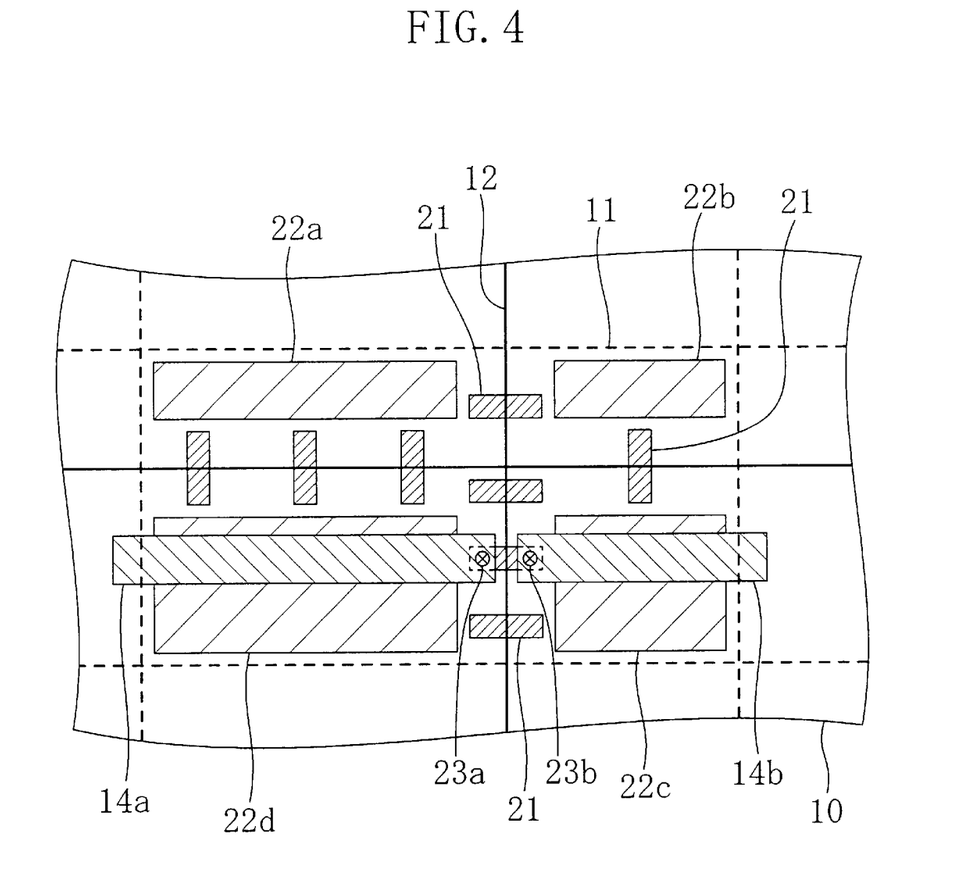
FIG. 4 is an enlarged plane view of a part of a semiconductor integrated circuit device according to a modification of Embodiment 2.

FIG. 4 is an enlarged plane view of a part of the semiconductor integrated circuit device of the modification of Embodiment 2. The semiconductor integrated circuit device of the modification of Embodiment 2 is obtained by improving one device region 11 of the semiconductor integrated circuit device of the modification of Embodiment 1 shown in FIG. 2, and in FIG. 4, like reference numerals are used to refer to like elements used in the modification of Embodiment 1 shown in FIG. 2 so as to omit the description.

The modification of Embodiment 2 is different from the modification of Embodiment 1 in routing terminals 21 each crossing a boundary between routing regions 12 being disposed within one of a plurality of device regions 11 as is shown in FIG. 4. Specifically, one device region 11 is divided into four small regions by boundaries between four adjacent routing regions (merely part of which are shown in FIG. 4), and the routing terminal 21 having a conducting property is formed so as to cross the boundary between the routing regions 12 and extend over two small regions. The routing terminal 21 is formed, for example, in an interconnect layer for a local interconnect, whereas the routing terminal 21 is connected to neither a semiconductor device nor a local interconnect.

In the modification of Embodiment 1, the functional block 13 is disposed within each device region 11 (as is shown in FIG. 2). In contrast, in the modification of Embodiment 2, a first sub-block 22a, a second sub-block 22b, a third sub-block 22c and a fourth sub-block 22d for constructing a functional block 13 are respectively disposed within the four small regions included in the device region 11 of FIG. 4. In this case, interconnects (not shown) for connecting the sub-blocks 22a through 22d are formed in regions between the routing terminals 21.

Also, as is shown in FIG. 4, the routing terminal 21 electrically connects a first global routing 14a and a second global routing 14b disposed within an adjacent pair of routing regions 12 to each other through a first contact 23a and a second contact 23b formed at the ends thereof. In this manner, the global routing 14 can be extended so as to substantially cross a boundary between the routing regions 12.

The modification of Embodiment 2 can attain the following effects in addition to the effects attained by the modification of Embodiment 1:

In the modification of Embodiment 1, each global routing 14 is disposed so as not to cross a boundary between the routing regions 12, and hence, the global routing 14 cannot be extended beyond a boundary between the routing regions 12, which restricts the freedom in the mask pattern layout design for the integrated circuit. In contrast, in the modification of Embodiment 2, the routing terminal 21 crossing a boundary between the routing regions 12 is disposed within the device region 11, and hence, the global routings 14 disposed in an adjacent pair of routing regions 12 can be connected to each other through the routing terminal 21. Accordingly, the global routing 14 can be formed to extend over substantially three or more device regions 11, resulting in improving the freedom in the mask pattern layout design for the integrated circuit.

Although the sub-blocks 22a through 22d are respectively disposed within the four small regions obtained by dividing the device region 11 by the boundaries between the routing regions 12 in the modification of Embodiment 2, the number of sub-blocks (plural) is not herein specified. In addition, the sub-block may be disposed so as to cover two or more of the plural small regions.

What is claimed is:

1. A semiconductor integrated circuit device comprising a plurality of semiconductor devices formed on a substrate,
    wherein a principal plane of said substrate is partitioned into a plurality of two-dimensionally arranged device regions and into a plurality of two-dimensionally arranged routing regions each crossing a plurality of boundaries between said plurality of device regions, such that said plurality of routing regions are shifted from said plurality of device regions by a distance, a plurality of device groups each including one or more semiconductor devices among said plurality of semiconductor devices and a local interconnect for connecting said semiconductor devices included in each said device group are disposed within said plurality of device regions, such that each boundary between said plurality of device regions is not crossed by said device group and said local interconnect, and a global routing for connecting said device groups to each other is disposed on said local interconnect within said plurality of routing regions, such that each boundary between said plurality of routing regions is not crossed by said global routing.

2. The semiconductor integrated circuit device of claim 1, wherein a routing terminal crossing a boundary between said plurality of routing regions is disposed within at least one of said plurality of device regions.

3. The semiconductor integrated circuit device of claim 1, wherein each said device region and each said routing region has one shape and is two-dimensionally arranged in a repetitive cycle corresponding to said shape.

4. The semiconductor integrated circuit device of claim 3, wherein said distance is a half of said repetitive cycle.

5. The semiconductor integrated circuit device of claim 1, wherein each said device region and each said routing region has a same shape.

6. The semiconductor integrated circuit device of claim 1, wherein a dimension of each said device region and each said routing region is set to be equal to or smaller than the size that pattern can be transferred by one exposure.

* * * * *